United States Patent
Kubo et al.

(10) Patent No.: US 8,954,220 B2
(45) Date of Patent: Feb. 10, 2015

(54) BATTERY CONDITION MONITORING DEVICE

(71) Applicant: Denso Corporation, Kariya, Aichi-pref. (JP)

(72) Inventors: Shunichi Kubo, Kariya (JP); Tsuneo Maebara, Nagoya (JP)

(73) Assignee: Denso Corporation, Kariya (JP)

( * ) Notice: Subject to any disclaimer, the term of this patent is extended or adjusted under 35 U.S.C. 154(b) by 16 days.

(21) Appl. No.: 13/873,874

(22) Filed: Apr. 30, 2013

(65) Prior Publication Data

US 2013/0338871 A1    Dec. 19, 2013

(30) Foreign Application Priority Data

Jun. 15, 2012 (JP) ................................. 2012-135637

(51) Int. Cl.
  G01R 31/36  (2006.01)
  B60L 11/18  (2006.01)
  H01M 10/48  (2006.01)
  H02J 7/00   (2006.01)

(52) U.S. Cl.
  CPC ......... *G01R 31/3606* (2013.01); *B60L 11/1851* (2013.01); *Y02T 10/7011* (2013.01); *G01R 31/3658* (2013.01); *H01M 10/48* (2013.01); *H01M 10/486* (2013.01); *H02J 7/0031* (2013.01); *H01M 2220/20* (2013.01); *H02J 7/0021* (2013.01)
  USPC ........... 701/29.2; 701/34.3; 701/34.4; 701/22

(58) Field of Classification Search
  None
  See application file for complete search history.

(56) References Cited

U.S. PATENT DOCUMENTS

| 5,281,919 A * | 1/1994 | Palanisamy .................. 324/427 |
| 2010/0004811 A1 * | 1/2010 | Kannan et al. .................. 701/29 |
| 2012/0065823 A1 | 3/2012 | Taguchi et al. |
| 2012/0185120 A1 * | 7/2012 | Miyazaki ........................ 701/22 |

FOREIGN PATENT DOCUMENTS

| JP | 2002-352839 | 12/2002 |
| JP | 2004/215366 | 7/2004 |
| JP | 2004-248466 | 9/2004 |
| JP | 2005/215366 | 8/2005 |
| JP | 2006/20380 | 1/2006 |
| JP | 2011-126327 | 6/2011 |
| JP | 2012-060842 | 3/2012 |

OTHER PUBLICATIONS

Office Action (2 pages) dated Apr. 22, 2014, issued in corresponding Japanese Application No. 2012-135637 and English translation (3 pages).

* cited by examiner

*Primary Examiner* — Michael J Zanelli
(74) *Attorney, Agent, or Firm* — Nixon & Vanderhye, P.C.

(57) ABSTRACT

A battery condition monitoring device has a control section for monitoring conditions of a high voltage battery on the basis of detection signals detected and transmitted by monitoring ICs. The control section has a main control section and a sub control section. When the main control section is in an abnormal condition, the sub control section detects the conditions of the high voltage battery, and instructs SMRs to turn on and off an electrical connection between the high voltage battery and a vehicle driving electric motor. The SMRs are arranged on connection lines through which the high voltage battery is connected to the vehicle driving electric motor.

15 Claims, 5 Drawing Sheets

FIG.1 BATTERY CONDITION MONITORING DEVICE

BATTERY CONDITION MONITORING DEVICE

CROSS-REFERENCE TO RELATED APPLICATION

This application is related to and claims priority from Japanese Patent Application No. 2012-135637 filed on Jun. 15, 2012, the contents of which are hereby incorporated by reference.

BACKGROUND OF THE INVENTION

1. Field of the Invention

The present invention relates to battery condition monitoring devices for monitoring various types of conditions of a high voltage battery which acts as a main driving power source mounted to hybrid vehicles and electric vehicles.

2. Description of the Related Art

Various types of battery condition monitoring devices have been proposed and used in vehicles such as hybrid vehicles and electric vehicles. Such a battery condition monitoring device monitors conditions of a battery capable of supplying electric power to a vehicle driving system of an electric vehicle. In more detail, the battery condition monitoring device detects various conditions of the battery such as a voltage, a temperature, etc. of the battery mounted to the electric vehicle. When detecting an occurrence of an abnormal condition such as a battery fault of the battery, the battery condition monitoring device disconnects the battery from the vehicle driving system in order to stop the supply of the electric power of the battery to the vehicle driving system mounted on the electric vehicle. For example, Japanese patent laid open publication No. JP 2006-20380 discloses a conventional battery condition monitoring device having the above structure.

However, the conventional battery condition monitoring device disclosed in JP 2006-20380 previously described has a drawback in that the structure cannot drive the vehicle driving system such as an electric motor when a main control circuit in the battery condition monitoring device malfunctions, but the battery is in a normal condition without any trouble because the conventional battery condition monitoring device has the structure in which the power supply from the battery to the sub-control section is inhibited when the main control section is in an abnormal condition. Accordingly, the conventional battery condition monitoring device having the structure previously described has a low malfunction resistance.

SUMMARY

It is therefore desired to provide a battery condition monitoring device for monitoring various types of conditions of a battery, for example a high voltage battery capable of supplying electric power to a vehicle driving system mounted to a vehicle such as a hybrid vehicle and an electric vehicle with safe and improved malfunction resistance.

The battery condition monitoring device as an exemplary embodiment detects various conditions of a battery mounted to a hybrid vehicle and an electric vehicle in order to provide electric power to a vehicle driving electric motor.

An exemplary embodiment provides a battery condition monitoring device for monitoring conditions of a battery such as a high voltage battery capable of supplying electric power to a vehicle driving source mounted to a vehicle. For example, such a vehicle driving source is a vehicle driving electric motor. The battery condition monitoring device has a battery condition detecting section, a main control section, and a sub-control section. The battery condition detecting section is configured to detect conditions of the battery and output detection signals indicating the detected conditions of the battery. The main control section is configured to receive the detection signals and detect whether or not the battery is in an abnormal condition on the basis of the received detection signals. The main control section controls an electrical connection state between the battery as a main driving power source and the vehicle driving source on the basis of a detection result. The sub-control section is configured to detect whether or not the main control section is in an abnormal condition, and control the electrical connection state between the battery and the vehicle driving source. The sub-control section detects whether or not the battery is in an abnormal condition on the basis of the detection signals when the detection result indicates that the main control section is in an abnormal condition. The sub-control section controls the electrical connection between the battery and the vehicle driving source on the basis of the detection result of the high voltage battery.

This structure makes it possible for the sub-control section to control the electrical connection between the battery and the vehicle driving source correctly even if the main control section is in an abnormal condition.

In addition, when the main control section is in an abnormal condition or a fault, the sub-control section monitors the conditions of the battery and controls the electrical connection between the battery and the vehicle driving source on the basis of the monitoring and detection result of the battery condition. For example, the vehicle driving source is a vehicle driving electric motor. This makes it possible to drive the vehicle driving source correctly when the battery is in a normal operation without any trouble, and can supply electric power correctly to the vehicle driving source even if the main control section is in an abnormal condition.

BRIEF DESCRIPTION OF THE DRAWINGS

A preferred, non-limiting embodiment of the present invention will be described by way of example with reference to the accompanying drawings, in which.

DETAILED DESCRIPTION OF THE PREFERRED EMBODIMENTS

Hereinafter, various embodiments of the present invention will be described with reference to the accompanying drawings. In the following description of the various embodiments, like reference characters or numerals designate like or equivalent component parts throughout the several diagrams.

First Exemplary Embodiment

A description will be given of a battery condition monitoring device according to a first exemplary embodiment.

Figure 1:
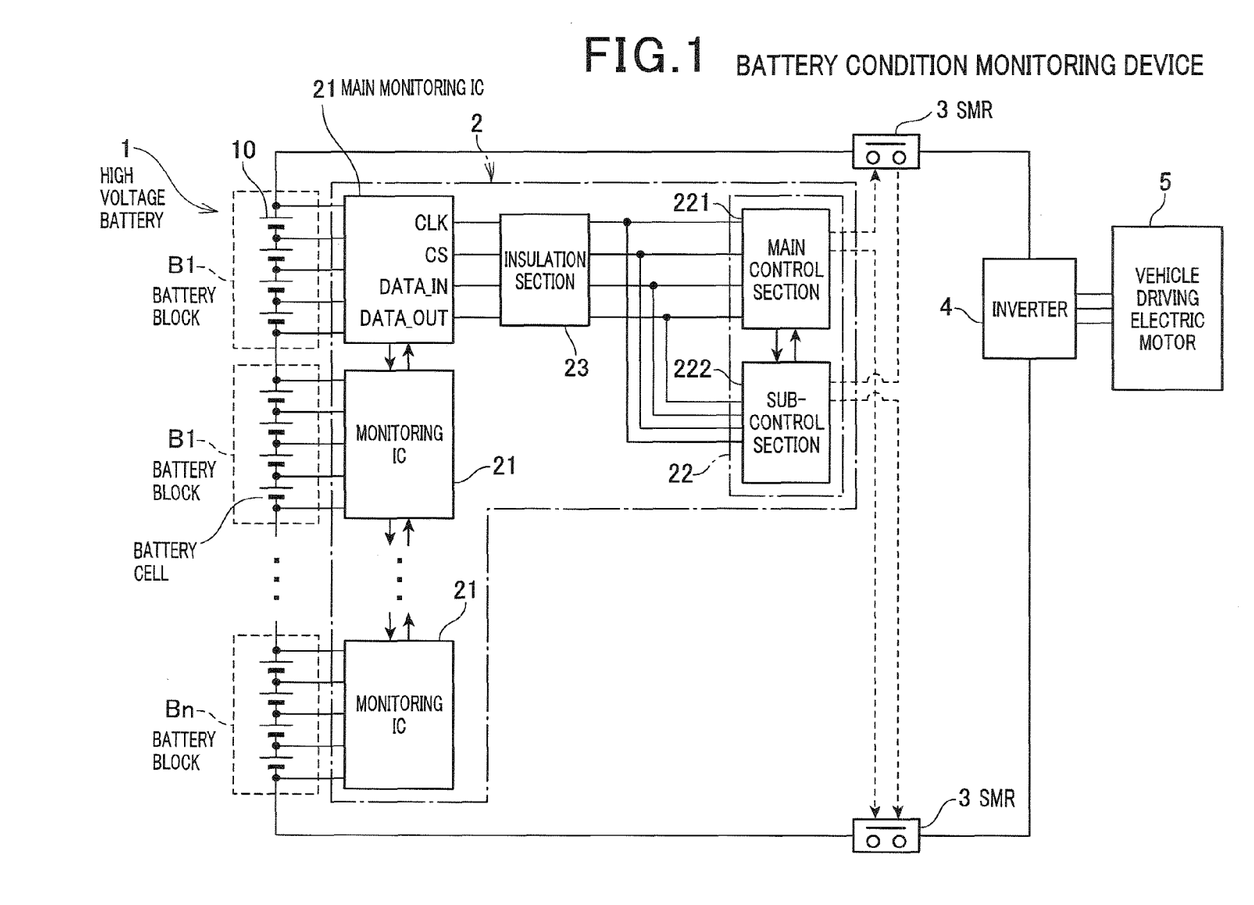
FIG. 1 is a view showing a schematic structure of an electric power system equipped with a battery condition monitoring device according to a first exemplary embodiment of the present invention.

FIG. 1 is a view showing a schematic structure of an electric power system equipped with the battery condition monitoring device 2 according to the first exemplary embodiment. That is, the first exemplary embodiment shows a case in which the power system equipped with the battery condition monitoring device 2 is mounted to a vehicle such as a hybrid vehicle and an electric vehicle.

As shown in FIG. 1, the power system is comprised of a high voltage battery 1, the battery monitoring device 2 according to the first exemplary embodiment, system main relays (SMRs) 3, an inverter 4 and a vehicle driving electric motor 5 as a vehicle driving source. The power system is mounted to a vehicle (not shown). The SMRs 3 are connected to a high voltage battery 1 (as a vehicle driving power source), and the SMRs 3 are further connected to the inverter 4. That is, the SMRs 3 are switch components for connecting and disconnecting a connection between the high voltage battery 1 and the vehicle driving electric motor 5. As will be explained later, the battery monitoring device 2 controls the operation of the SMRs 3 in order to connect and disconnect the connection between the high voltage battery 1 and the vehicle driving electric motor 5. Further, the battery condition monitoring device 2 according to the first exemplary embodiment is connected between the high voltage battery 1 and the SMRs 3.

The SMRs 3 form an electrical connection switching section for switching between a turned-on state (a connection state) and a turned-off state (a disconnection state) of the electrical connection between the high voltage battery 1 and the vehicle-driving electric motor 5, etc.

The SMRs 3 switch to the electrical connection state (turned-on state) between the high voltage battery 1 and the vehicle-driving electric motor 5, etc. from the electric disconnection state (turned-off state) when the vehicle starts to drive.

Further, the SMRs 3 switch to the electric disconnection state (turned-off state) between the high voltage battery 1 and the vehicle driving electric motor 5, etc. from the electrical connection state (turned-on state) when the vehicle stops driving, and the high voltage battery 1 is in a battery fault, namely in an abnormal condition. The battery condition monitoring device 2 according to the first exemplary embodiment and an upper side control section 100 (which will be explained later in detail) generate and output control signals in order to control the operation of each of the SMRs 3.

The high voltage battery 1 supplies electric power to the vehicle-driving electric motor 5 and various electric loads. The high voltage battery 1, used in the power system equipped with the battery condition monitoring device 2 according to the first exemplary embodiment, is comprised of rechargeable batteries (or secondary batteries) such as lithium batteries in which battery cells 10 are connected in series. The battery cells are divided to a plurality of blocks Bn (n=1, 2, . . . and n, n is a positive integer). The battery cells 10 in each group are arranged in series to be adjacent to each other. In each block Bn, the battery cells 10 are connected in series. The battery blocks composed of the battery cells 10 are also connected in series.

The battery condition monitoring device 2 is connected to the high voltage battery 1 through detection lines. The battery condition monitoring device 2 detects various conditions of the high voltage battery 1 such as a voltage, a temperature, a current, etc. of each of the battery cells 10 in each battery block Bn.

Specifically, the battery condition monitoring device 2 is comprised of a plurality of monitoring integrated circuits (monitoring ICs) 21, a control section 22, and an insulation section 23. The monitoring ICs 21 are arranged to the battery blocks Bn, respectively. The control section 22 monitors whether or not the high voltage battery 1 is in an abnormal condition such as a battery fault. Interactive communication is available between each monitoring IC 21 and the control section 22.

The plural monitoring ICs 21 are configured to detect the conditions of the high voltage battery 1, and generate and output detection signals to the control section 22. The detection signals indicate various conditions of the battery cells 10 in the high voltage battery 1. That is, the plural monitoring ICs 21 act as a battery condition detection section.

That is, the monitoring ICs 21 are configured to detect the conditions of the high voltage battery 1 such as a current which is flowing in the high voltage battery 1, a block voltage of each of the battery blocks B1, . . . , and Bn, a cell voltage of each battery cell 10, a temperature of each of the battery blocks B1, . . . and Bn, etc.

The monitoring ICs 21 are connected in a daisy chain connection so as to communicate to each other between adjacent monitoring ICs 21. One of the monitoring ICs 21 is connected to the control section 21, which will be referred to as a main monitoring IC 21. FIG. 1 shows a structure of the plural monitoring ICs 21 comprised of a main monitoring IC 21 and the other monitoring ICs 21 sequentially connected in series.

This structure of the main monitoring IC 21 and the other monitoring ICs 21 makes it possible to sequentially transmit a control signal output from the control section 22, to each of the monitoring ICs 21 through the main monitoring IC 21 connected to the control section 22. In addition, the structure of the monitoring ICs 21 including the main monitoring IC 21 makes it possible to transmit a detection signal output from each monitoring IC 21 including the main monitoring IC 21 to the control section 22 through the main monitoring IC 21 connected to the control section 22.

Each of the monitoring ICs 21 including the main monitoring IC 21 has a chip select terminal (CS), a clock signal terminal (CK), a data input terminal (DATA_IN), and a data output terminal (DATA_OUT). Each monitoring IC 21 including the main monitoring IC 21 is comprised of a hardware section and a software program stored in a memory section (not shown) in the hardware section in order to detect the conditions of the high voltage battery 1. The hardware section and the software program in each monitoring IC 21 including the main monitoring IC 21 form a detection section 21a.

The control section 22 is comprised of a main control section 221 and a sub-control section 222. The main control section 221 controls the operation of the monitoring ICs 21 including the main monitoring IC 21 and the SMRs 3, etc. The main control section 221 detects an occurrence of an abnormal condition such as a battery fault of the high voltage battery 1. When the main control section 221 is in a battery fault, namely, enters battery abnormal condition, the sub-control section 222 controls the operation of the monitoring ICs 21 including the main monitoring IC 21 and the SMRs 3, etc. instead of the main control section 221.

Each of the main control section 221 and the sub-control section 222 is comprised of a microcomputer and peripheral devices. The microcomputer is comprised of a central processing unit (CPU), a read only memory (ROM), a random access memory (RAM), an electrically erasable programmable read only memory (EEPROM), etc. The CPU executes programs stored in the ROM, etc. in order to execute various processes.

Figure 2:
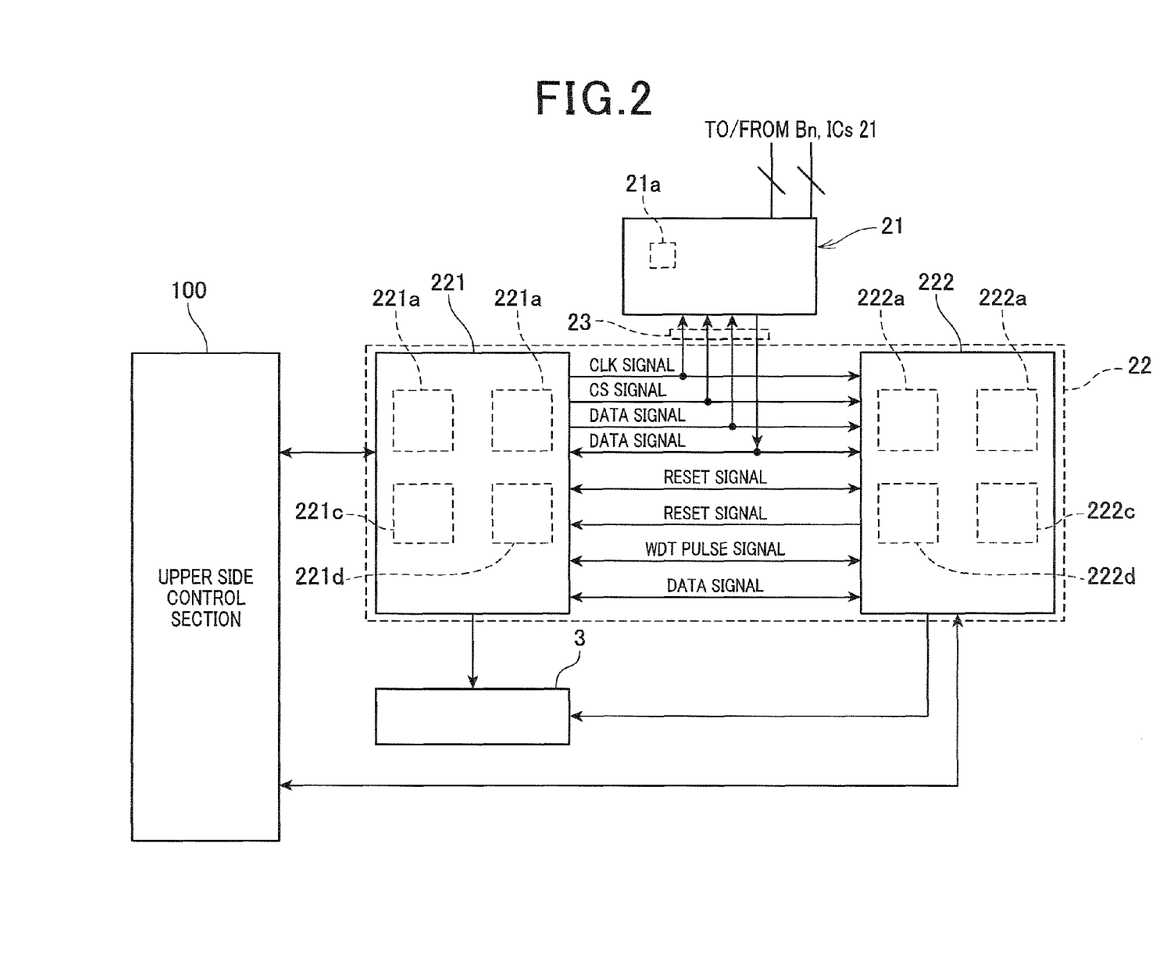
FIG. 2 is a block view showing a schematic structure of the battery condition monitoring device according to the first exemplary embodiment of the present invention.

FIG. 2 is a block view showing a schematic structure of the battery condition monitoring device 2 according to the first exemplary embodiment. As shown in FIG. 2, the main control section 221 and the sub-control section 222 are connected to the upper side control section 100 through a controller area network bus (CAN bus). The upper side control section 100 monitors and controls the entire system of the vehicle. Data communication is available between the upper side control section 100 and each of the main control section 221 and the sub-control section 222 through the CAN bus.

The main control section 221 is connected to the sub-control section 222 through communication lines in order to transmit information to each other. Specifically, a watch dog pulse signal (WDT pulse signal), a reset signal, a data signal (DATA signal) indicating a diagnostic result, etc. are transmitted between the main control section 221 and the sub-control section 222 through the communication lines.

The main control section 221 outputs to the monitoring IC 21 including the main monitoring IC 21a chip select signal (CS signal), a clock signal (CLK signal), control signals for instructing the monitoring ICs 21 to monitor the conditions of the high voltage battery 1. Further, the main control section 221 receives the detection signals. The detection signals (data signals) indicate the conditions of the high voltage battery 1. The main control section 221 detects whether or not the high voltage battery 1 is in an abnormal condition such as a battery fault on the basis of the received detection signals transmitted from the monitoring ICs 21 including the main monitoring IC 21.

For example, the main control section 221 detects whether or not each of the battery blocks B1, . . . , and Bn and each of the battery cells 10 is over discharged or over charged on the basis of the detection signals regarding a block voltage and a cell voltage transmitted from the monitoring ICs 21 including the main monitoring IC 21. Further, the main control section 221 detects whether or not each of the battery blocks B1, . . . , and Bn and each of the battery cells 10 is overheated (or is suffering from some other temperature anomaly) on the basis of detection signals, which indicate a battery temperature thereof, transmitted from the monitoring ICs 21 including the main monitoring IC 21.

When the monitoring result of the high voltage battery 1 indicates a major abnormal condition (for example, abnormal overheat and an overcharge of the high voltage battery 1) which affects the safe operation of the vehicle, the main control section 221 transmits the control signals to the SMRs 3 in order to turn off the SMRs 3. This makes it possible to disconnect the high voltage battery 1 from the vehicle-driving electric motor 5 mounted to the vehicle. In this case, the main control section 221 outputs to the upper side control section 100 an abnormal signal and a control signal, where the abnormal signal indicates that the high voltage battery 1 is in an abnormal condition, and the control signal indicates that the SMRs 3 are turned off.

The main control section 221 in the battery condition monitoring device 2 according to the first exemplary embodiment has a memory section and programs stored in the memory section. In addition to this structure, the main control section 221 has a self-diagnostic function configured to detect an occurrence of an abnormal condition or a fault of the memory and the programs stored in the memory section when a system in the battery condition monitoring device 2 is initialized or restarted. When the detection result of the self-diagnostic function indicates that the main control section 221 is in an abnormal condition or a fault, the main control section 221 generates and outputs the abnormal signal to the upper side control section 100 and the sub-control section 222. The abnormal signal indicates an occurrence of an abnormal condition or a fault of the main control section 221.

The main control section 221 has a reset function configured to stop the operation of the main control section 221 itself and restart the operation thereof when receiving a reset signal transmitted from the sub-control section 222. The reset function makes it possible to prevent the main control section 221 from falling into an uncontrollable state and executing an abnormal operation.

Further, the main control section 221 has a monitoring function configured to detect an occurrence of an abnormal condition or a fault of the sub-control section 222 on the basis of the WDT pulse signal transmitted from the sub-control section 222. When the detection result indicates an occurrence of an abnormal condition or a fault of the sub-control section 222, the main control section 221 outputs the reset signal to the sub-control section 222 in order to prevent the sub-control section 222 from falling into an uncontrollable state.

The components such as hardware and software in the main control section 221 capable of controlling the monitoring ICs 21 including the main monitoring IC 21 and the SMRs 3 form a main operation control section 221a. Further, the components such as hardware and software in the main control section 221 for detecting an occurrence of an abnormal condition or a fault of each of the monitoring ICs 21 including the main monitoring IC 21 and the sub-control section 222 form a main monitoring control section 221b. Further, the components in the main control section 221 capable of executing the self-diagnostic function form a self-diagnostic section 221c. The components in the main control section 221 capable of executing the reset function form a main reset section 221d.

The sub-control section 222 has a monitoring function for monitoring an occurrence of an abnormal condition or a fault of the main control section 221 on the basis of the control signals such as the WDT pulse signal and the control signal indicating the result of the self-diagnostic transmitted from the main control section 221.

When the detection result indicates that the main control section 221 is in an abnormal condition, the sub-control section 222 outputs the reset signal to the main control section 221 in order to prevent the main control section 221 from falling into an uncontrollable state. The sub-control section 222 is configured to output the abnormal signal indicating an occurrence of an abnormal condition or a fault of the main control section 221 to the upper side control section 100.

The sub-control section 222 outputs the chip select signal, the clock signal, and the control signal indicating the monitoring ICs 21 including the main monitoring IC 21 to monitor the high voltage battery 1. The sub-control section 222 further receives detection signal transmitted from the monitoring ICs 21 including the main monitoring IC 21, and detects an occurrence of an abnormal condition such as a battery fault of the high voltage battery 1 on the basis of the received detection signal.

The sub-control section 222 turns off the SMRs 3 in order to disconnect the high voltage battery 1 from the vehicle-driving electric motor 5 when the detection result indicates that the high voltage battery 1 is in an abnormal condition. At this time, the sub-control section 222 outputs the abnormal signal to the upper side control section 100, where the abnormal signals indicate an occurrence of an abnormal condition such as a battery fault of the high voltage battery 1 and that the SMRs 3 are turned off.

Because the sub-control section 222 and the main control section 221 execute the same monitoring operation of the monitoring ICs 21 including the main monitoring IC 21, the explanation of the monitoring operation of the sub-control section 222 is omitted here for brevity.

The sub-control section 222 has the self-diagnostic function for diagnosing whether or not each of the memory section and a program counter is an abnormal condition or a fault, etc. when the system starts to operate. When the diagnostic result indicates an occurrence of an abnormal condition or a fault, the sub-control section 222 outputs the abnormal signal, which indicates an occurrence of an abnormal condition or a fault of the memory and/or the program counter, to the main control section 221, and the sub-control section 222 is configured not to execute any control to the SMRs 3.

By the way, when both the main control section 221 and the sub-control section 222 are in an abnormal condition or a fault simultaneously, and do not control the SMRs 3 correctly, the upper side control section 100 turns off the SMRs 3.

The sub-control section 222 has a reset function capable of restarting itself, namely the sub-control section 222 when receiving the reset signal transmitted from the main control section 221. This function makes it possible to prevent the sub-control section 222 from falling into an uncontrollable state when the sub-control section 222 is in an abnormal condition.

The components such as hardware and software in the sub-control section 222 capable of controlling the monitoring ICs 21 including the main monitoring IC 21 and the SMRs 3 form a sub-operation control section 222a. Further, the components such as hardware and software in the sub-control section 222 for detecting an occurrence of an abnormal condition or a fault of the monitoring ICs 21 including the main monitoring IC 21 and the main control section 221 form a sub-monitoring control section 222b. Further, the components in the sub-control section 222 capable of executing the self-diagnostic function form a self-diagnostic section 222c. The components in the sub-control section 222 capable of executing the reset function form a sub-reset section 222d.

Next, a description will now be given of the monitoring process of monitoring the conditions of the high voltage battery 1 by the battery condition monitoring device 2 according to the first exemplary embodiment.

Under the condition in which electric power is supplied to the monitoring ICs 21 including the main monitoring IC 21 and the control section 22, the battery condition monitoring device 2 executes the monitoring process periodically or at a timing when receiving the control signal transmitted from the main control section 221.

A description will now be given of the monitoring process of monitoring the conditions of the high voltage battery 1 by the main control section 221 in the control section 22 in the battery condition monitoring device 2 according to the first exemplary embodiment. In the following case, the main control section 221 operates correctly, and the self-diagnostic result of the main control section 221 indicates no occurrence of an abnormal condition or a fault of the main control section 221, and the diagnostic result of the sub-control section 222 indicates no occurrence of an abnormal condition or a fault of the main control section 221.

The main control section 221 in the control section 22 outputs the control signal to the main monitoring ICs 21 connected to the main control section 221 through the insulation section 23 in order that the monitoring ICs 21 including the main monitoring IC 21 monitor the conditions of the high voltage battery 1.

When receiving the control signal transmitted from the main control section 221, the main monitoring IC 21 connected to the main control section 221 outputs the control signal to the other monitoring ICs 21 in order to monitor the battery blocks B1, . . . , and Bn. The monitoring ICs 21 monitor the corresponding battery blocks Bn, respectively through the detection lines. The monitoring ICs 21 transmit the detection signals indicating the condition of the battery clocks Bn to both the main control section 221 and the sub-control section 222 through the main monitoring IC 21 connected to the main control section 221.

The main control section 221 detects an occurrence of an abnormal condition such as a battery fault of the high voltage battery 1 on the basis of the detection signals transmitted from each of the monitoring ICs 21. The detection result indicates no occurrence of an abnormal condition such as a battery fault of the high voltage battery 1 or indicates an occurrence of a negligible abnormal state of the high voltage battery 1, the main control section 221 continues the electrical connection state between the high voltage battery 1 and the vehicle-driving electric motor 5, etc., without controlling the SMRs 3.

On the other hand, when the detection result indicates an occurrence of a non-negligible abnormal state of the high voltage battery 1, the main control section 221 turns the MSRs 3 off in order to disconnect the high voltage battery 1 from the vehicle-driving electric motor 5, etc. Further, the main control section 221 generates and output the abnormal signal indicating an occurrence of an abnormal condition such as a battery fault of the high voltage battery 1 and the turned-off state of the SMRs 3 to the upper side control section 100.

Because the main control section 221 operates correctly, the sub-control section 222 receives the detection signals transmitted from the monitoring ICs 21 only, not executes the monitoring of the high voltage battery 1 and the control to the SMRs 3.

A description will now be given of the process to monitor the high voltage battery 1 by the sub-control section 222 in the control section 22 in the battery condition monitoring device 2 according to the first exemplary embodiment with reference to FIG. 3.

Figure 3:
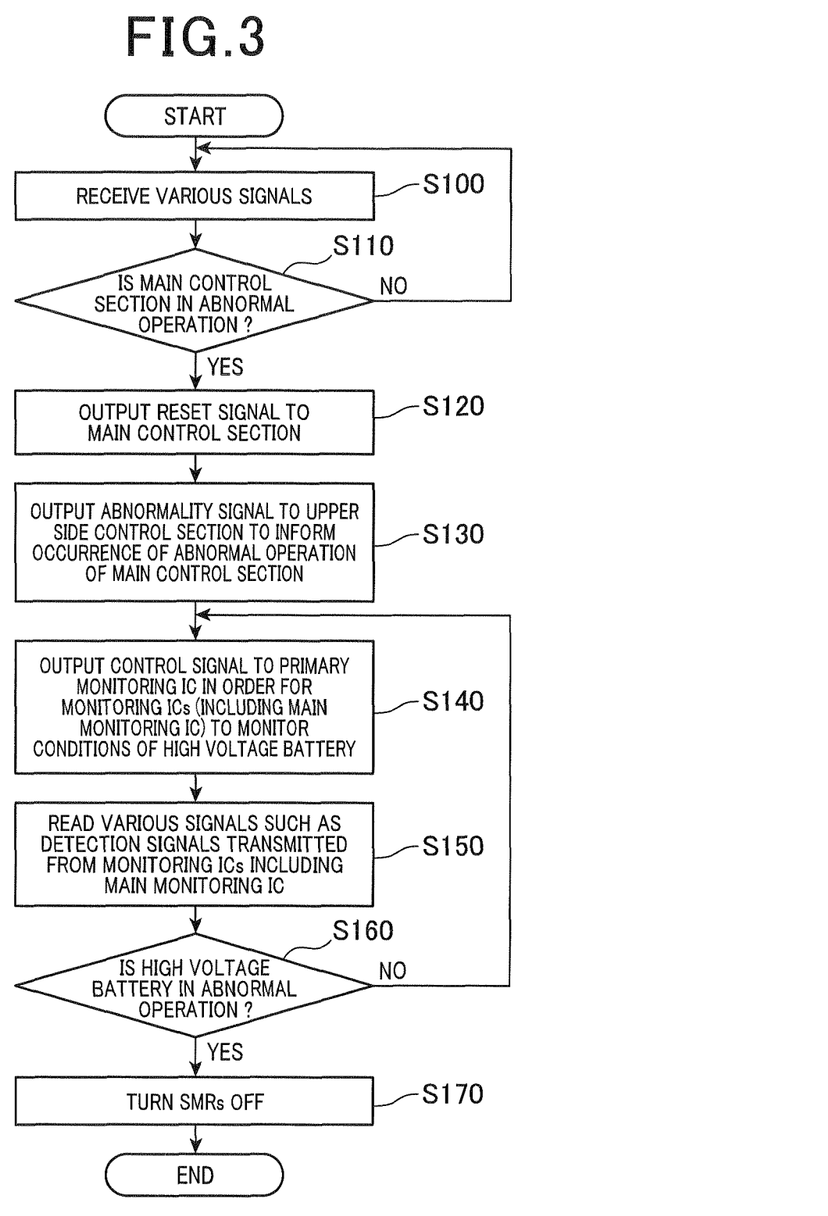
FIG. 3 is a view showing a flow chart of a control process executed by a sub-control section in a control section in the battery control device according to the first exemplary embodiment of the present invention.

FIG. 3 is a view showing a flow chart of a control process executed by the sub-control section 222 in the control section 22 in the battery control device 2 according to the first exemplary embodiment.

As shown in FIG. 3, in step S100, the sub-control section 222 receives the detection signals transmitted from the monitoring ICs 21, the WDT pulse signal, the DATA signals such as the DATA signal indicating the self-diagnostic result of the main control section 221 transmitted from the main control section 221. The operation flow goes to step S110. In step S110, the sub-control section 222 detects whether or not an occurrence of an abnormal condition or a fault of the main control section 221 on the basis of the received signals.

Specifically, in step S110, the sub-control section 222 determines an occurrence of an abnormal condition or a fault of the main control section 221 when receiving no WDT pulse signal transmitted from the main control section 221 for a predetermined time length because the main control section 221 periodically outputs the WDT pulse signal to the sub-control section 222. Instead of the above detection in step S110, it is also possible for the sub-control section 222 to determine an occurrence of an abnormal condition or a fault of the main control section 221 when receiving the DATA signal, transmitted from the main control section 221, which contains the self-diagnostic result indicating an occurrence of an abnormal condition or a fault of the main control section 221.

When the detection result in step S110 indicates negation ("NO" in step S110), namely, indicates that the main control section 221 has no occurrence of an abnormal condition or a fault, the operation flow returns to step S100.

On the other hand, when the detection result in step S110 indicates affirmation ("YES" in step S110), namely indicates an occurrence of an abnormal condition or a fault of the main control section 221, the operation flow goes to step S120.

In step S120, the sub-control section 222 outputs the reset signal to the main control section 221 in order to stop the operation of the main control section 221. At this time, when the main control section 221 restarts its operation and the main control section 221 outputs the control signal to the monitoring ICs 21, because there is a possibility of preventing the execution of a correct operation of the sub-control section 222, it is preferable for the sub-control section 222 to continuously output the reset signal to the main control section 221.

The operation flow goes to step S130 from step S120. In step S130, the sub-control section 222 outputs the abnormal signal to the upper side control section 100, which indicates an occurrence of an abnormal condition or a fault of the main control section 221. It is possible for the upper side control section 100 to detect an abnormal condition or a fault of the main control section 221 when receiving the abnormal signal transmitted from the sub-control section 222.

The operation flow goes to step S140 from step S130. In step S140, the sub-control section 222 outputs the control signal, which indicates to monitor the high voltage battery 1, to the main monitoring IC 21 connected to the sub-control section 222 through the insulation section 23. At this time, it is preferable for the sub-control section 222 to output the chip selection signal to the main control section 221 in order to establish the communication between the sub-control section 222 and the main monitoring IC 21 and to disconnect the communication between the main control section 221 and the main IC 21.

In step S140, the main monitoring IC 21 connected to the sub-control section 222 outputs the control signal to the other monitoring ICs 21 in order to monitor the conditions of the high voltage battery 1. The operation flow goes to step S150 from step S140. In step S150, each of the monitoring ICs 21 detects the conditions of the corresponding battery block Bn through the detection lines, and outputs the detection signal, which indicates the conditions of the battery blocks Bn, to the sub-control section 222 through the main monitoring IC 21. The monitoring ICs 21 continuously output the detection signals to the sub-control section 222 regardless of an occurrence of an abnormal condition or a fault of the main control section 221.

The operation flow goes to step S150 from step S140. In step S150, the sub-control section 222 receives various types of signals such as the detection signals transmitted from the monitoring ICs 21. The operation flow goes to step S160 from step S150. In step S160, the sub-control section 222 monitors an occurrence of an abnormal condition or a fault of the high voltage battery 1, and detects whether or not the high voltage battery 1 is in an abnormal condition on the basis of the detection signals transmitted from the monitoring ICs 21.

When the detection result in step S160 indicates negation ("NO" in step S160), namely, indicates that the high voltage battery 1 is in a correct operation, the operation flow returns to step S140. That is, when the detection result in step S160 indicates that the high voltage battery 1 operates correctly without any trouble, the sub-control section 222 does not instruct the SMRs 3, and the electrical connection between the high voltage battery 1 and the vehicle-driving electric motor 5 is maintained.

On the other hand, when the detection result in step S160 indicates affirmation ("YES" in step S160), namely, indicates that the high voltage battery 1 is in an abnormal condition, the operation flow goes to step S170. In step S170, the sub-control section 222 instructs the SMRs 3 to be turned off in order to disconnect the vehicle-driving electric motor 5 from the high voltage battery 1. That is, the sub-control section 222 switches to the electric disconnection state from the electrical connection state between the high voltage battery 1 and the vehicle-driving electric motor 5 by using the SMRs 3. AT this time, the sub-control section 222 outputs an abnormality signal to the upper side control section 100, which indicates an occurrence of an abnormal condition such as a battery fault of the high voltage battery 1 and a turned-off state of the SMRs 3, etc.

In the battery condition monitoring device according to the first exemplary embodiment previously described, the sub-control section 222 monitors an occurrence of an abnormal condition or a fault t of the main control section 221. When the detection result indicates an occurrence of an abnormal condition or a fault of the main control section 221, the sub-control section 222 monitors the conditions of the high voltage battery 1 instead of the main control section 221, and switches to the electrical connection state and the electric disconnection state between the high voltage battery 1 and the vehicle-driving electric motor 5 on the basis of the detection result of the monitoring.

The structure of the battery condition monitoring device according to the first exemplary embodiment makes it possible to maintain the safe drive of the vehicle even if the main control section 221 is in an abnormal condition because the sub-control section 222 can correctly controls the electrical connection state between the high voltage battery 1 and the vehicle-driving electric motor 5.

Further, even if the main control section 221 is in an abnormal condition, but the high voltage battery 1 correctly operates and supplies electric power to the vehicle-driving electric motor 5 without any trouble, because the sub-control section 222 correctly drives the vehicle-driving electric motor 5, it is possible to improve and increase a fault resistance of the battery condition monitoring device 2.

Accordingly, it is possible for the battery condition monitoring device according to the first exemplary embodiment to correctly supply electric power to the vehicle-driving electric motor 5, etc. and to increase the fault resistance and safety in driving the vehicle, Further, the battery condition monitoring device according to the first exemplary embodiment has a structure in which the sub-control section 222 has the self-diagnostic function, and the sub-control section 222 does not control the SMRs 3 (to switch to the electrical connection state and the electric disconnection state between the high voltage battery 1 and the vehicle-driving electric motor 5) when the sub-control section 222 is in an abnormal condition. This structure makes it possible to avoid any occurrence of an unnecessary electrical connection between the high voltage battery 1 and the vehicle-driving electric motor 5. Accordingly, this structure makes it possible to guaranty the reliability of the battery condition monitoring device.

Still further, when the main control section 221 is in an abnormal condition in the battery condition monitoring device according to the first exemplary embodiment, the sub-control section 222 outputs the reset signal to the main control section 221 in order to stop the operation of the main control section 221. This control makes it possible to prevent an occurrence of a wrong electrical connection between the high voltage battery 1 and the vehicle-driving electric motor 5 by the main control section 221 in an abnormal condition. This makes it possible to increase the reliability of the battery condition monitoring device 2.

Still further, when the main control section 221 in the battery condition monitoring device according to the first exemplary embodiment is in an abnormal condition, the sub-control section 222 outputs the monitoring results, namely, the detection results of the main control section 221 to the upper side control section 100. This control makes it possible for the upper side control section 100 to obtain an occurrence of an abnormal condition or a fault of the main control section 221. That is, the upper side control section 100 can execute the entire system of the vehicle while considering an occurrence of an abnormal condition or a fault of the upper side control section 100.

Second Exemplary Embodiment

A description will be given of the battery condition monitoring device according to a second exemplary embodiment with reference to FIG. 4 and FIG. 5.

Figure 4:
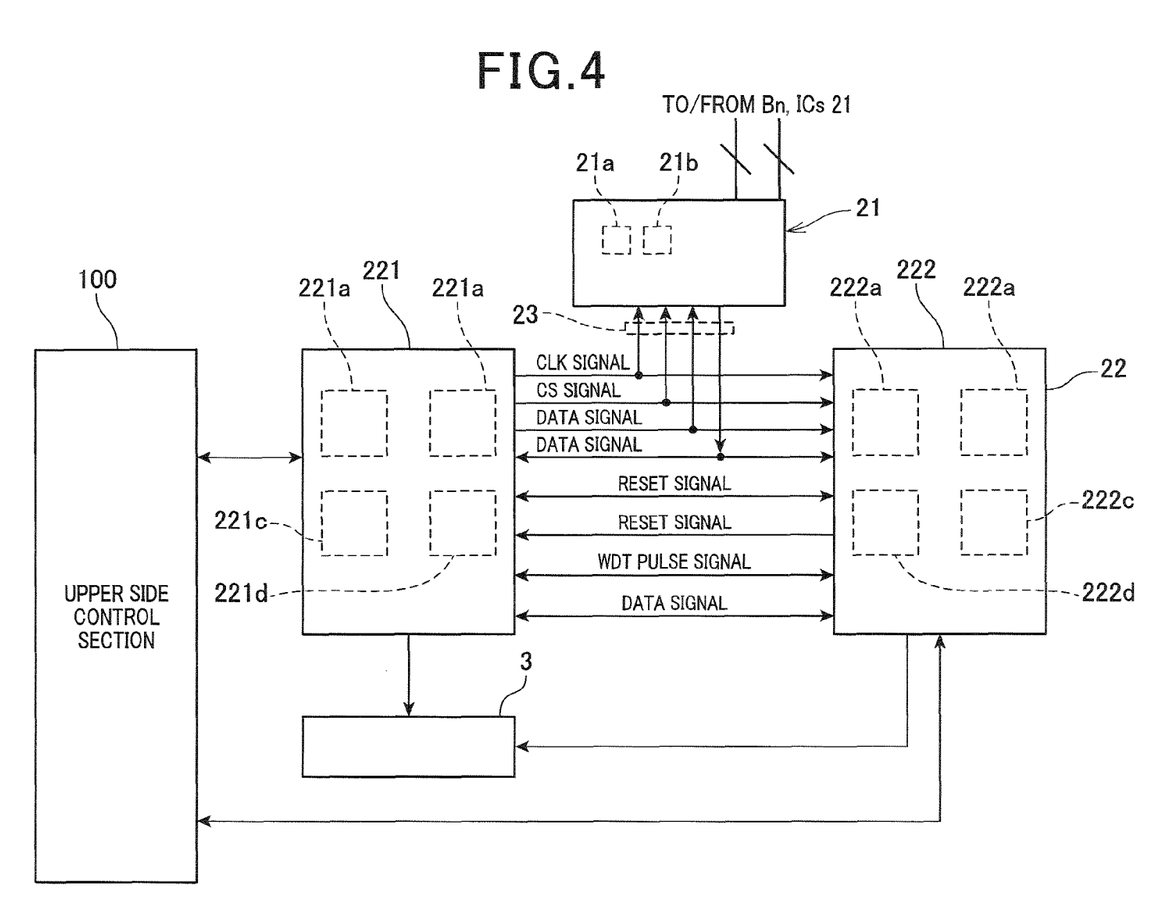
FIG. 4 is a block view showing a schematic structure of the battery condition monitoring device according to a second exemplary embodiment of the present invention.

FIG. 4 is a block view showing a schematic structure of the battery condition monitoring device 2 according to the second exemplary embodiment. The monitoring ICs 21 in the battery condition to monitoring device 2 according to the second exemplary embodiment output the detection signals to the control section 22 by a process which is different from the output process used in the battery condition monitoring device 2 according to the first exemplary embodiment. The explanation for the same components and operation between the first exemplary embodiment and the second exemplary embodiment is omitted here for brevity.

Like the power system according to the first exemplary embodiment having the structure shown in FIG. 1, the battery condition monitoring device 2 according to the second exemplary embodiment is used in the power system. The power system is comprised of the high voltage battery 1, the battery monitoring device 2 according to the second exemplary embodiment, the system main relays (SMRs) 3, the inverter 4 and the vehicle driving electric motor 5 as a vehicle driving source. The power system is mounted to a vehicle which is omitted from FIG. 4.

In the battery condition monitoring device according to the second exemplary embodiment, the main monitoring IC 21 has a monitoring function for detecting whether or not the main control section 221 is in an abnormal condition on the basis of the control signal transmitted from the control section 22. Specifically, the main monitoring IC 21 is configured to determine an occurrence of an abnormal condition or a fault of the main control section 221 when the control signal transmitted from the main control section 221 includes an abnormal signal which indicates an occurrence of an abnormal condition or a fault of the main control section 221.

For example, the main monitoring IC 21 has a memory (not shown) into which data items indicating all patterns of various control signals to be transmitted from the main control section 221 are stored in advance. The main monitoring IC 21 is configured to compare the control signal transmitted from the main control section 221 with the data items stored in the memory. When the control signal transmitted from the main control section 221 is not equal to any data items stored in the memory, the main monitoring IC 21 judges an occurrence of an abnormal condition or a fault of the main control section 221.

It is also acceptable for the main monitoring IC 12 to detect an occurrence of an abnormal condition or a fault of the main control section 221 when does not receiving the CS signal and the CLK signal for a predetermined time length because the main control section 221 periodically outputs the CS signal and the CLK signal when the main control section 221 is in an normal operation, namely operates correctly.

The main monitoring IC 12 used in the battery condition monitoring device 2 according to the first exemplary embodiment is configured to change the content of various output signals transmitted to the control section 22 on the basis of the monitoring result of the main control section 221.

Specifically, when the main control section 221 is in an abnormal condition or a fault, the main monitoring IC 21 is configured to output some specific detection signals to the sub-control section 222, namely, to select some specific detection signals from all of the detection signals and output the selected specific detection signals to the sub-control section 222 as compared with the detection signals to be outputted to the sub-control section 222 when the main control section 221 correctly operates.

That is, the main monitoring IC 21 selects some specific detection signals from all of the detection signals, and outputs the selected specific detection signals only when the main control section 221 is in an abnormal condition. The selected detection signals include important information regarding safe operation of the high voltage battery 1 and safety in driving the vehicle when the main control section 221 is in an abnormal condition. In this case, it is preferable for the main monitoring IC 21 to output at least one of the detection signals regarding the important information such as a voltage of the high voltage battery 1 (a voltage of each block battery Bn and a voltage of each cell (a cell voltage)) for safety in driving the vehicle and a temperature of the high voltage battery 1.

It is also acceptable for the main monitoring IC 21 to select the detection signals indicating a high voltage value and a high temperature within a predetermined range from all of the detection signals, and output the selected detection signals to the sub-control section 222.

As shown in FIG. 4, an IC side monitoring section 21b in the main monitoring IC 21 is formed by the function of monitoring an occurrence of an abnormal condition or a fault of the main control section 221 and the structure to select the important detection signals from all of the detection signals and to output the selected detection signals to the sub-control section 222.

Figure 5:
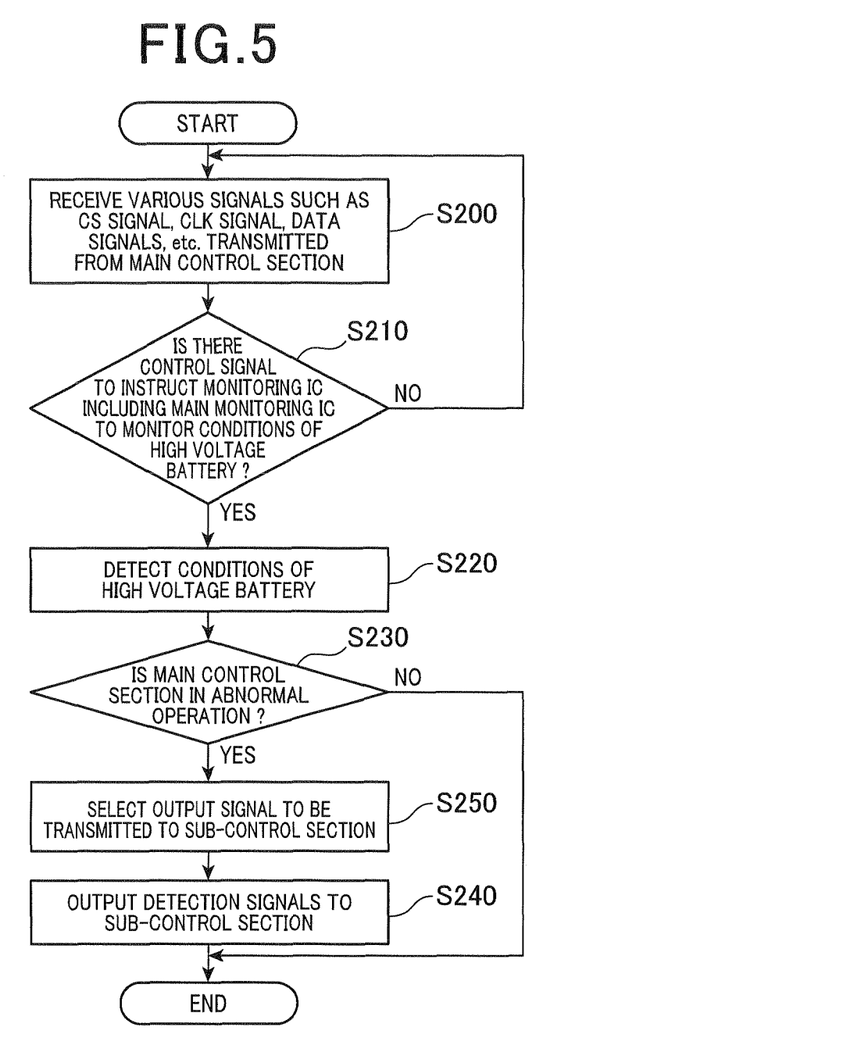
FIG. 5 is a view showing a flow chart of a control process executed by a monitoring IC in the battery control device according to the second exemplary embodiment of the present invention.

FIG. 5 is a view showing a flow chart of a control process executed by the main monitoring IC 21 in the battery control device 2 according to the second exemplary embodiment.

As shown in FIG. 5, in step S200, the main monitoring IC 21 receives the CS signal, the CLK signal, the DATA signal, etc. transmitted from the control section 22. The operation flow goes to step S210. In step S210, the main monitoring IC 21 then detects whether or not the control section 22 outputs the control signal to instruct the monitoring ICs 21 including the main monitoring IC 21 to monitor the conditions of the high voltage battery 1.

When the detection result in step S210 indicates negation ("NO" in step S210), the operation flow returns to step S200.

On the other hand, when the detection result in step S210 indicates affirmation ("YES" in step S210), namely, indicates that the control signal to instruct the monitoring ICs 21 including the main monitoring IC 21 to monitor the conditions of the high voltage battery 1, the operation flow goes to step S220.

In step S220, the monitoring ICs 21 including the main monitoring IC 21 detect the various conditions of the high voltage battery 1, for example, a voltage, a temperature, a current, etc., of the corresponding battery blocks Bn in the high voltage battery 1.

The operation flow goes to step S230. In step S230, the main monitoring IC 21 detects whether or not the main control section 221 is in an abnormal condition on the basis of the control signal transmitted from the control section 22.

When the detection result in step S230 indicates negation ("NO" in step S230), namely indicates that the main control section 221 operates correctly without any trouble, the operation flow goes to step S240. In step S240, the main monitoring IC 21 outputs all of the detection signals obtained in step S220 to the control section 22.

On the other hand, when the detection result in step S230 indicates affirmation ("YES" in step S230), namely indicates that the main control section 221 is in an abnormal condition, the operation flow goes to step S250. In step S250, the main monitoring IC 21 selects some specific control detection signals from all of the detection signals obtained in step S220. The operation flow goes to step S240.

In step S240, the main monitoring IC 21 outputs the selected detection signals only to the control section 22, namely, to the sub-control section 222, not to the main control section 221.

On the other hand, as previously described, the main monitoring IC 21 in the battery condition monitoring device 2 according to the first exemplary embodiment is configured to output all of the detection signals regardless of the condition of the main control section 221 even if the main control section 221 is in an abnormal condition. Accordingly, the main control section 22, for example the sub-control section 222 must receive and analysis all of the detection signals transmitted from the main monitoring IC 21 and the other monitoring ICs 21 when the main control section 221 is in an abnormal condition.

On the other hand, the main monitoring IC 21 in the battery condition monitoring device 2 according to the second exemplary embodiment detects whether or not the main control section 221 is in an abnormal condition on the basis of the control signals transmitted form the main control section 221. The main monitoring IC 21 selects some specific detection signals from all of the detection signals obtained through the monitoring ICs 21 including the main monitoring IC 21 when the detection result indicates that the main control section 221 is in an abnormal condition, and outputs the selected detection signals to the sub-control section 222 in the control section 22.

The structure of the battery condition monitoring device 2 according to the second exemplary embodiment makes it possible to decrease a processing load of the sub-control section when the detection result indicates that the main control section 221 is in an abnormal condition. This structure makes it possible to decrease a manufacturing cost of the battery condition monitoring device 2 according to the second exemplary embodiment.

Furthermore, the battery condition monitoring device 2 according to the second exemplary embodiment has the structure in which the main monitoring IC 21 outputs to the sub-control section 222 the detection signal which indicates at least one of a voltage and a temperature of the high voltage battery 1 when the detection result indicates that the main control section 221 is in an abnormal condition.

This structure makes it possible for the sub-control section 222 to obtain at least one of important information of the high voltage battery 1, for example, a voltage and a temperature of the high voltage battery 1 in view of maintaining safe operation of the high voltage battery 1 and safety in driving the vehicle. The sub-control section 222 can control the electrical connection state between the high voltage battery 1 and the vehicle-driving electric motor 5 mounted to the vehicle while considering safe operation of the high voltage battery 1.

(Other Modifications)

The concept of the present invention is not limited by the disclosure of the first exemplary embodiment and the second exemplary embodiment, previously described. For example, it is possible for the battery condition monitoring device to have following structures.

(1) In order to prevent each of the main control section 221 and the sub-control section 222 from falling into an uncontrollable state, it is preferable for each of the main control section 221 and the sub-control section 222 to have a self-diagnostic function. On the other hand, it is possible for the battery condition monitoring device to have a structure without such a self-diagnostic function when the main control section 221 and the sub-control section 222 can monitor the condition of the main control section 221 and the sub-control section 222 to each other on the basis of WDT pulse signals, for example.

(2) In the structure of the battery condition monitoring device according to the first exemplary embodiment and the second exemplary embodiment, previously described, the sub-control section 222 outputs the reset signal to the main control section 221 in order to stop the operation of the main control section 221 when the main control section 221 is in an abnormal condition. However, the concept of the present invention is not limited by the structure disclosed by the first exemplary embodiment and the second exemplary embodiment. For example, it is possible for the battery condition monitoring device to have a structure in which a switching element is arranged between the main control section 221 and the sub-control section 222, and the sub-control section 222 instructs the switching element (for example, SMRs) to disconnect the electrical connection between the main control section 221 and the sub-control section 222 when the main control section 221 is in an abnormal condition.

(3) In the structure of the battery condition monitoring device according to the first exemplary embodiment and the second exemplary embodiment, previously described, one of the main control section 221 and the sub-control section 222 outputs the abnormal signal to the upper side control section 100 when the main control section 221 is in an abnormal condition. However, the concept of the present invention is not limited by the structure disclosed by the first exemplary embodiment and the second exemplary embodiment. For example, it is possible for the battery condition monitoring device to have a structure in which one of the main control section 221 and the sub-control section 222 outputs the abnormal signal to another control section such as a motor control section (not shown), instead of the upper side control section 100 when each of the main control section 221, the sub-control section 222 and the high voltage battery 1 is in an abnormal condition. The motor control section controls the operation of the vehicle-driving electric motor 5 mounted to the vehicle (4) The first exemplary embodiment and the second exemplary embodiment disclose the battery condition monitoring device previously described, having the structure in which each of the main monitoring IC 21 and the other monitoring ICs 21 are connected in a daisy chain connection so as to communicate to each other between adjacent monitoring ICs 21. However, the concept of the present invention is not limited by the structure disclosed by the first exemplary embodiment and the second exemplary embodiment. For example, it is possible for the battery condition monitoring device to have a structure in which each of the monitoring ICs 21 is directly connected to the control section 22 through the insulation section 23.

While specific embodiments of the present invention have been described in detail, it will be appreciated by those skilled in the art that various modifications and alternatives to those details could be developed in light of the overall teachings of the disclosure. Accordingly, the particular arrangements disclosed are meant to be illustrative only and not limited to the scope of the present invention which is to be given the full breadth of the following claims and all equivalents thereof.

What is claimed is:

1. A battery condition monitoring device for monitoring conditions of a battery capable of supplying electric power to a vehicle driving source mounted to a vehicle,
   the battery condition monitoring device comprising:
   a battery condition detecting section configured to detect conditions of the battery and output detection signals indicating the detected conditions of the battery;
   a main control section configured to receive the detection signals transmitted from the battery condition detecting section, and detect whether or not the battery is in an abnormal condition on the basis of the received detection signals, and control an electrical connection state between the battery and the vehicle driving source on the basis of a detection result of the battery; and
   a sub-control section configured to detect whether or not the main control section is in an abnormal condition, and control the electrical connection state between the battery and the vehicle driving source, the sub-control section, detecting whether or not the battery is in an abnormal condition on the basis of the detection signals transmitted from the battery condition detecting section when the detection result indicates that the main control section is in an abnormal condition, and control the electrical connection state between the battery and the vehicle driving source on the basis of the detection result of the high voltage battery;
   wherein the sub-control section has a self-diagnostic function for the detecting a condition of the sub-control section, and
   the sub-control section does not execute a control of the electrical connection state between the battery and the vehicle driving source when the detection result of the self-diagnostic function indicates that the sub-control section is in an abnormal condition even if the ection result indicates that the main control section is in an abnormal condition.

2. The battery condition monitoring device according to claim 1, wherein the main control section is configured to stop the operation thereof when receiving a reset signal, the sub-control section is configured to output the reset signal to the main control section, and the sub-control section is configured to output the reset signal to the main control section when the detection result indicates that the main control section is in an abnormal condition.

3. The battery condition monitoring device according to claim 1, wherein the main control section is configured to stop the operation thereof when receiving a reset signal, the sub-control section is configured to output the reset signal to the main control section, and the sub-control section is configured to output the reset signal to the main control section when the detection result indicates that the main control section is in an abnormal condition.

4. The battery condition monitoring device according to claim 1, wherein the sub-control section outputs to an upper side control section a signal indicating the detection result of the main control section when the detection result indicates that the main control section is in an abnormal condition, where the upper side control section controls an entire system of the vehicle.

5. The battery condition monitoring device according to claim 1, wherein the sub-control section outputs to an upper side control section a signal indicating the detection result of the main control section when the detection result indicates that the main control section is in an abnormal condition, where the upper side control section controls an entire system of the vehicle.

6. The battery condition monitoring device according to claim 1, wherein the main control section is configured to output a control signal to the battery condition detecting section, and
   the battery condition detecting section is configured to detect whether or not the main control section is in an abnormal condition on the basis of the control signal transmitted from the main control section, and
   the battery condition detecting section is configured to decide that the main control section is in an abnormal condition when the control signal transmitted from the main control section indicates an occurrence of an abnormal condition in the main control section.

7. The battery condition monitoring device according to claim 6, wherein the battery condition detecting section is configured to output the detection signals to the main control section and the sub-control section, and select some specific detection signals from all of the detection signals when the detection result indicates that the main control section is in an abnormal condition as compared with the detection signals output when the main control section is in a normal condition without any trouble.

8. The battery condition monitoring device according to claim 1, wherein the main control section is configured to output a control signal to the battery condition detecting section, and
   the battery condition detecting section is configured to detect whether or not the main control section is in an abnormal condition on the basis of the control signal transmitted from the main control section, and
   the battery condition detecting section is configured to decide that the main control section is in an abnormal condition when the control signal transmitted from the main control section indicates an occurrence of an abnormal condition in the main control section.

9. The battery condition monitoring device according to claim 1, wherein the main control section is configured to periodically output Ethel (a control signal to the battery condition detecting section, and
   the battery condition detecting section is configured to detect whether or not the main control section is in an abnormal condition on the basis of the control signal transmitted from the main control section, and to decide that the main control section is in an abnormal condition when receiving no control signal transmitted from the main control section for a predetermined time length.

10. The battery condition monitoring device according to claim 9, wherein the battery condition detecting section is configured to output the detection signals to the main control section and the sub-control section, and select some specific detection signals from all of the detection signals when the detection result indicates that the main control section is in an abnormal condition as compared with the detection signals output when the main control section is in a normal operation without any trouble.

11. The battery condition monitoring device according to claim 1, wherein the main control section is configured to periodically output control signal to the battery condition detecting section, and the battery condition detecting section is configured to detect whether or not the main control section is in an abnormal condition on the basis of the control signal transmitted from the main control section, and to decide that the main control section is in an abnormal condition when receiving no control signal transmitted from the main control section for a predetermined time length.

12. The battery condition monitoring device according to claim 1, wherein the battery condition detecting section is configured to output at least one of the detection signals indicating voltage information and temperature information of the battery to the sub-control section when the detection result indicates that the main control section is in an abnormal condition.

13. The battery condition monitoring device according to claim 1, wherein the battery condition detecting section is configured to output at least one of the detection signals indicating voltage information and temperature information of the battery to the sub-control section when the detection result indicates that the main control section is in an abnormal condition.

14. The battery condition monitoring device according to claim 1, wherein the battery is a high voltage battery comprised of a plurality of battery blocks, each of the battery blocks is comprised of a plurality of battery cells, and the battery condition detecting section is comprised of a plurality of monitoring integrated circuits connected in a daisy chain connection, and the monitoring integrated circuits correspond to the battery blocks, respectively.

15. An electric power system to be mounted to a vehicle, comprising:

a battery configured to supply electric power to a vehicle driving source;

the battery monitoring device for monitoring conditions of the battery according to claim 1; and system main relays arranged between the battery and the vehicle driving source in order to form the electrical connection between the battery and the vehicle driving source, and each of the main control section and the sub control section in the battery monitoring device instructs the system main relays to connect and disconnect the electrical connection between the battery and the vehicle driving source.

* * * * *